STABILIZED VOLTAGE SOURCE FOR TRANSISTORIZED CIRCUITS

Filed Oct. 25, 1963

Inventors
Saburo Oniki
Satoshi Shimada

Hill, Sherman, Meroni, Gross & Simpson by Attys

Nov. 15, 1966 SABURO ONIKI ETAL 3,286,124

STABILIZED VOLTAGE SOURCE FOR TRANSISTORIZED CIRCUITS

Filed Oct. 25, 1963 2 Sheets-Sheet 2

Inventors
Saburo Oniki
Satoshi Shimada by Hill, Sherman, Meroni, Gross & Simpson Attys.

3,286,124

STABILIZED VOLTAGE SOURCE FOR TRANSISTORIZED CIRCUITS

Saburo Oniki and Satoshi Shimada, Ohta-ku, Tokyo, Japan, assignors to Sony Corporation, Tokyo, Japan, a corporation of Japan Filed Oct. 25, 1963, Ser. No. 319,055
Claims priority, application Japan, Oct. 29, 1962, 37/64,201
4 Claims. (Cl. 315—27)

The present invention relates to transistor circuits, and more particularly, to output-transformerless circuits sometimes identified as "OTL" circuits.

One of the objectives of the present invention is to provide an improved power supply circuit which is capable of providing a stable voltage to preceding stages even when the power source varies.

A further object of the invention is to provide an improved power supply for a multistage amplifier circuit composed of transistors.

A further object of the invention is to provide a transistor circuit in which the load itself is employed as a part of a decoupling circuit to supply a stable source of power to preceding transistorized circuits.

Another object of the invention is to provide a novel transistor circuit in which one electrode of the output transistor is connected to a power source together with one side of the load, and the other end of the load is connected to the power source through a capacitor, the connection point between the load and the capacitor being employed as a stabilized output source for preceding stages.

Other objects, features and advantages of the present invention will become apparent to those skilled in the art from the following description taken in conjunction with the accompanying drawings, in which.

Figure 1:
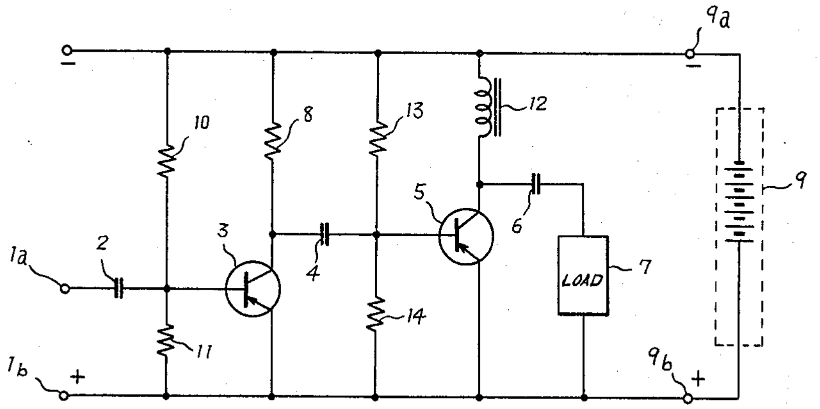
Fig. 1 PRIOR ART
FIGURE 1 is a circuit diagram illustrating a prior art form of output transformerless transistor circuit heretofore employed.

FIGURE 1 illustrates a conventional transistor circuit which has been illustrated purely for purposes of comparison with the novel circuit of the present invention. In FIGURE 1, the alternating signal input is applied across terminals 1*a* and 1*b*, and the signal is applied across the base and emitter of a transistor 3 through a coupling capacitor 2. The output of the transistor 3 is derived between its collector and emitter, and is supplied between the base and emitter of a transistor 5 of a succeeding stage through a coupling capacitor 4. The output of the transistor 5 is derived between its collector and emitter and supplied to a load 7 through a capacitor 6 which serves to block direct current in the load. The collector of the transistor 3 is connected through a load resistor 8 to one end 9*a* of a direct current power source 9, and the emitter of transistor 3 is connected to the opposite end 9*b*, of the power source. A pair of resistors 10 and 11 in series are connected across the power source 9, and their point of connection is connected to the base of the transistor 3 to thereby supply a suitable bias thereto. The collector of the transistor 5 is connected to power source terminal 9*a* through a direct current bypass element which may be a choke coil 12. The emitter of the transistor 5 is connected to the other end, 9*b*, of the power source 9. The base of the transistor 5 is connected through resistors 13 and 14 appearing across the power source 9 to supply a suitable bias voltage thereto.

In the type of circuit illustrated in FIGURE 1, if the voltage of the power source 9 varies, the working voltages of the transistors 3 and 5 will vary correspondingly, causing variations in the voltage appearing across the load 7. Where a multistage amplifier is involved, these variations in preceding stages will be applied in amplified form to the load 7, thereby making it impossible to obtain a faithful reproduction of the input signal.

The circuit of the present invention effectively removes the disadvantages of the type of circuit shown in FIGURE 1 by stabilizing the power supply to the various stages.

Figure 2:
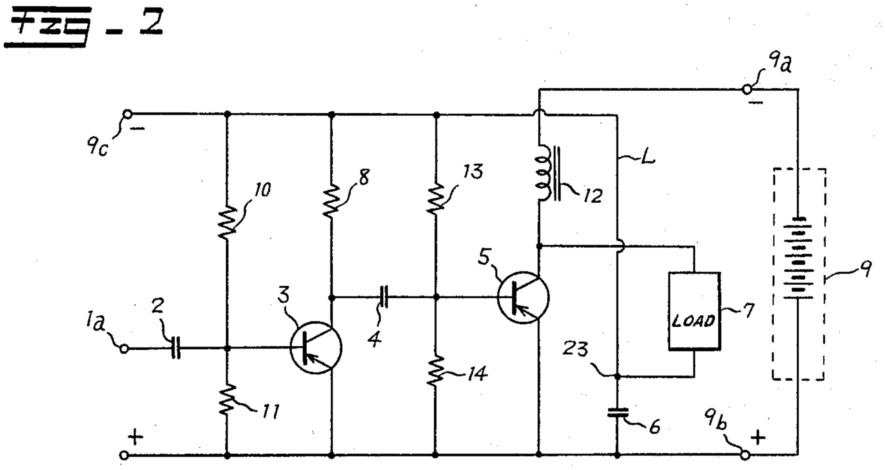
FIGURE 2 is a circuit diagram illustraing an output transformerless transistor circuit embodying the principles of the present invention.

The circuit shown in FIGURE 2 employs the same reference numerals for corresponding parts shown in FIGURE 1, the differences coming in the means for supplying the power source to the transistors. In the circuit of FIGURE 2, the collector of the transistor 5 is connected through the choke coil 12 to the power source terminal 9*a*, and one terminal of the load 7 is similarly connected. The other terminal of the load 7 is connected through the capacitor 6 to the other power source terminal 9*b*. The junction between the load 7 and the capacitor 6, identified at reference numeral 23, is used as a stabilized power supply, with a lead L being provided to connect this junction with a terminal 9*c* to supply a stabilized voltage to preceding stages.

It will be seen that the bias of the transistor 5 is thus applied through a decoupling circuit composed of the load 7 and the capacitor 6, the capacitor 6 functioning to filter out any variations. The transistor 3 is operated by the charge on the capacitor 6, since the collector and emitter of this transistor are connected directly across the capacitor 6 by means of the lead L and the resistor 8. The capacitor 6 couples the emitter of the transistor 5 and the load 7 in the alternating current circuit. The capacitor 6 has a relatively large capacity (0.1 microfarad or so) so that it does not affect the frequency characteristics of the circuit. Any variations in voltage occurring at the power source 9 are shunted by this capacitor so that a stable output source is obtained to the transistor circuits between the terminals 9*b* and 9*c*.

Figure 3:
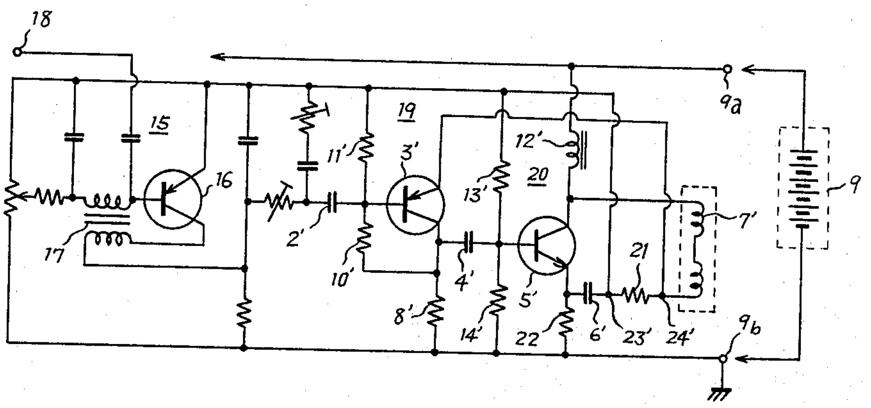
FIGURE 3 is a circuit diagram of one embodiment of the invention as is applied to a vertical deflection circuit of a television receiver.

The circuit of FIGURE 3 illustrates the manner in which the circuitry of the present invention can be applied to a vertical deflection circuit of a television receiver. In FIGURE 3, reference numeral 15 indicates generally a blocking oscillator including a transistor 16. The oscillator circuit includes a decoupling transformer 17, and the base of the transistor 16 is fed with a vertical synchronzing signal from an input terminal 18.

Reference numeral 19 has been applied generally to the deflection current amplifier which includes a transistor 3′ correspondign to the transistor 3 in FIGURE 2. Reference numeral 20 refers broadly to a deflection power amplifier having a transistor 5′ corresponding to transistor 5 of FIGURE 2. Between the collector and emitter of the transistor 5′ there is connected a parallel circuit of a deflection coil 7′ corresponding to the load 7 of FIGURE 2, a resistor 21 and a capacitor 6′ corresponding to the capacitor 6 in FIGURE 2. The emitter of the transistor 5′ is connected through a resistor 22 to one end 9*b* of a power source 9′, and the voltage between the connection point 23′ and the terminal 9*b* is used as a power source for the transistor 16 and as a base bias power source for the transistors 3′ and 5′. The voltage occurring at the junction of the resistor 21 and the coil 7′, represented at reference numeral 24′ is used as the power source to be applied between the collector and the emitter of the transistor 3′. Other circuit elements corresponding to those in FIGURE 2 are marked with the same reference numeral, except that they have a prime superscript.

In the transistor circuit shown in FIGURE 3, there will be substantially no variation in the storages preceding the output transistor 5' because of voltage variation in the power source 9'. Accordingly, a substantially stable vertical deflection current is applied to the deflection coil 7', and a substantially stabilized current flows in the blocking oscillator 15.

It will be apparent that many modifications and variations may be effected without departing from the scope of the present invention.

We claim as our invention:

1. A transistor circuit comprising an output transistor having a base, a collector electrode, and an emitter electrode, a source of electrical power, a load, means connecting said collector electrode and one end of said load to one side of said source of power, means conecting said emitter electrode to the other side of said source of power, a coupling capacitor connected between the other end of said load and said other side of said source of power, and means for tapping off a relatively stable voltage at the junction between said coupling capacitor and said load.

2. The circuit of claim 1 in which said means connecting said collector electrode to said one end of said source of power includes a direct current bypass element.

3. The circuit of claim 2 in which said bypass element is a choke coil.

4. The circuit of claim 1 in which said load is a television receiver deflection coil.

References Cited by the Examiner

UNITED STATES PATENTS 3,198,978 8/1965 Taylor .............. 315—27

DAVID G. REDINBAUGH, *Primary Examiner.*

T. A. GALLAGHER, *Assistant Examiner.*